(12) United States Patent  (10) Patent No.: US 8,829,933 B2
Yun et al.  (45) Date of Patent: Sep. 9, 2014

(54) SEMICONDUCTOR APPARATUS AND PROBE TEST METHOD THEREOF

(75) Inventors: Tae Sik Yun, Ichon-shi (KR); Jong Chern Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 971 days.

(21) Appl. No.: 12/836,538

(22) Filed: Jul. 14, 2010

(65) Prior Publication Data
US 2011/0156736 A1 Jun. 30, 2011

(30) Foreign Application Priority Data
Dec. 28, 2009 (KR) .................. 10-2009-0131791

(51) Int. Cl.
G01R 31/20 (2006.01)
H01L 21/66 (2006.01)
G11C 29/00 (2006.01)

(52) U.S. Cl.
CPC .............. H01L 22/34 (2013.01); G11C 29/006 (2013.01)
USPC .............. 324/754.03; 324/750.3; 324/754.01; 324/762.1; 438/14; 438/18; 714/724

(58) Field of Classification Search
USPC ............................ 324/750.3, 754.01, 754.03, 324/762.01–762.1; 438/14, 18; 714/724; 257/48, 207, 210–211
See application file for complete search history.

(56) References Cited

U.S. PATENT DOCUMENTS

| 5,059,899 | A | | 10/1991 | Farnworth et al. |
| 5,477,062 | A | * | 12/1995 | Natsume ......................... 257/48 |
| 5,796,745 | A | | 8/1998 | Adams et al. |
| 6,025,733 | A | * | 2/2000 | Saitoh et al. ................ 324/750.3 |
| 6,268,642 | B1 | * | 7/2001 | Hsuan et al. ................... 257/620 |
| 6,360,344 | B1 | | 3/2002 | Khoche et al. |
| 6,400,173 | B1 | * | 6/2002 | Shimizu et al. .......... 324/754.07 |
| 6,681,358 | B1 | | 1/2004 | Karimi et al. |
| 7,034,560 | B2 | | 4/2006 | Farnworth et al. |
| 7,330,043 | B2 | * | 2/2008 | Yamamoto et al. ....... 324/762.05 |
| 7,378,290 | B2 | * | 5/2008 | Cowles et al. .................. 438/18 |
| 2003/0137308 | A1 | | 7/2003 | Wang |
| 2005/0015539 | A1 | * | 1/2005 | Horii et al. ..................... 711/103 |
| 2005/0251713 | A1 | | 11/2005 | Lee |
| 2007/0090848 | A1 | * | 4/2007 | Tumin et al. .................. 324/761 |
| 2009/0273098 | A1 | * | 11/2009 | Bartley et al. ................. 257/778 |
| 2010/0013512 | A1 | * | 1/2010 | Hargan et al. ................. 324/765 |

FOREIGN PATENT DOCUMENTS

| JP | 2001-296337 | | 10/2001 |
| JP | 2002-022803 | | 1/2002 |
| JP | 2002-141383 | A | 5/2002 |
| JP | 2005-322375 | | 11/2005 |
| KR | 1019990000471 | A | 1/1999 |
| KR | 1020050028740 | A | 3/2005 |
| KR | 1020090095003 | A | 9/2009 |

* cited by examiner

Primary Examiner — Jermele M Hollington
Assistant Examiner — Temilade S Rhodes-Vivour
(74) Attorney, Agent, or Firm — William Park & Associates Ltd.

(57) ABSTRACT

Various embodiments of a semiconductor apparatus and related methods are disclosed. In one exemplary embodiment, a semiconductor apparatus may include a chip, scribe lanes disposed around the chip, and a probe test logic circuit for conducting a probe test on the chip. The probe test logic circuit is disposed on a portion of the scribe lanes.

17 Claims, 4 Drawing Sheets

SEMICONDUCTOR APPARATUS AND PROBE TEST METHOD THEREOF

CROSS-REFERENCES TO RELATED APPLICATION

The present application claims priority under 35 U.S.C. §119(a) to Korean Patent Application No. 10-2009-0131791, filed on Dec. 28, 2009, in the Korean Intellectual Property Office, which is incorporated herein by reference in its entirety as if set forth in full.

BACKGROUND

1. Technical Field

Various embodiments of the present invention relate to semiconductor apparatuses and related methods. In particular, certain exemplary embodiments relate to a semiconductor apparatus and a probe test method thereof.

2. Related Art

A semiconductor apparatus, in particular, a memory apparatus has a memory core for storing data. Logic circuits for ensuring the normal operation of the semiconductor apparatus and for performing tests are generally disposed in a peripheral region of the memory core. The logic circuits for performing tests may include a probe test logic circuit for measuring the internal voltage levels or for performing a probe test to detect a defective cell. The probe test is generally performed when a semiconductor chip is in a wafer form.

FIG. 1 is a schematic view illustrating the layout of a chip of a conventional semiconductor apparatus. In the chip shown in FIG. 1, a probe test logic circuit 15 for performing a probe test of the chip is disposed in a peripheral region PERI of the chip. Logic circuits 11, 12, 13 and 14 for ensuring the normal operation of the semiconductor apparatus are also disposed in the peripheral region PERI of the chip. Peripheral region PERI is surrounded by a memory core comprised of one or more memory banks BANK0 through BANK7, and the edge regions of the chip serve as scribe lanes Scribe Lane. After the probe test of the chip is performed on the wafer, a semiconductor apparatus can be manufactured by cutting the wafer along the scribe lanes in the edge regions and packaging the chip.

A probe test logic circuit for performing the probe test may be useless except when the chip is tested on the wafer. However, since the probe test logic circuit is conventionally disposed in the peripheral region PERI where a logic circuit for ensuring the normal operation of the semiconductor apparatus and bondings of pads are located, the probe test logic circuit could not be easily removed.

Meanwhile, a three-dimensional semiconductor apparatus that stacks and packages a plurality of chips in a single package has been recently developed to enhance the degree of integration of a semiconductor apparatus. Because two or more chips are vertically stacked, such a three-dimensional semiconductor apparatus can attain an increased degree of integration in the same amount of space. Moreover, a Through Silicon Via (TSV) method, which forms a silicon via through a plurality of vertically stacked chips to electrically connect one another, has been in use recently. Since a semiconductor apparatus that uses the TSV method vertically passes through and electrically connects the stacked chips, the packaging area of the semiconductor apparatus can be efficiently decreased when compared to a semiconductor apparatus that electrically connects each of the chips using bonding wires disposed in the edges of the chips.

When TSVs are used, although a single semiconductor apparatus can be formed by stacking a plurality of chips having the same structure, a single semiconductor apparatus is generally composed of one main chip for controlling the entire operation of the semiconductor apparatus and a plurality of slave chips for storing data. The main chip, as shown in FIG. 1, may include both a logic circuit and a pad disposed in the peripheral region PERI of the chip. The main chip may further include a memory core. For the slave chip, it may be sufficient to include only a memory core, a logic circuit for repair, and a logic circuit for TSV connection.

In order to improve the price competitiveness of a semiconductor apparatus, it may be important to increase the number of chips that are disposed on a single wafer. However, manufacturing the slave chips according to the above-mentioned conventional methods may not permit such an increase in the total number of chips on a wafer and therefore is economically inefficient.

SUMMARY

Accordingly, various exemplary embodiments of the invention may provide semiconductor apparatuses and/or methods that may improve the economic efficiency and thereby price competitiveness of a semiconductor apparatus. In particular, certain exemplary embodiments may provide semiconductor apparatuses and related methods that can allow a logic circuit for conducting a probe test to be removed after completing the probe test, which in turn may increase the wafer space available for placing additional number of chips.

To attain the advantages and in accordance with the purposes of the invention, as embodied and broadly described herein, one exemplary aspect of the invention may provide a semiconductor apparatus comprising a chip, scribe lanes disposed around the chip, and a probe test logic circuit for conducting a probe test on the chip. According to another aspect, the probe test logic circuit may be disposed on a portion of the scribe lanes.

According to some exemplary aspects, a semiconductor apparatus may comprise a first chip, a second chip, a scribe lane disposed between the first and second chips, and a probe test logic circuit for probe testing both the first and second chips. The probe test logic circuit may be disposed on the scribe lane. Further, the scribe lane and the probe test logic circuit disposed on the scribe lane may be removed after the probe tests are completed.

In another exemplary aspect, a semiconductor apparatus may comprise a chip on a wafer, a scribe lane disposed on the wafer adjacent the chip for separating the chip from a neighboring chip on the wafer, and a logic circuit for conducting a probe test on the chip. The logic circuit may be disposed on the scribe lane such that the logic circuit is removed when the wafer is cut along the scribe lane to separate the chip from the neighboring chip.

In still another exemplary aspect, a probe test method for a semiconductor apparatus may comprise: providing a semiconductor apparatus comprising a first chip and a second chip sharing a probe test logic circuit; performing a probe test of the first chip in response to a first chip select signal; performing a probe test of the second chip in response to a second chip select signal; repairing the first chip depending upon a probe test result of the first chip; repairing the second chip depending upon a probe test result of the second chip; and removing the probe test logic circuit.

Another exemplary aspect of the invention may provide a method of manufacturing a semiconductor apparatus. The method may comprise: providing a first chip and a second chip on a wafer; providing a logic circuit for conducting a probe test on the first chip and the second chip, where the logic circuit is disposed on a scribe lane between the first chip and the second chip; performing probe tests on the first and second chips using the logic circuit; and cutting the wafer along the scribe lane to separate the first and second chips from one another. In an exemplary aspect, the logic circuit may be removed when the wafer is cut along the scribe lane.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
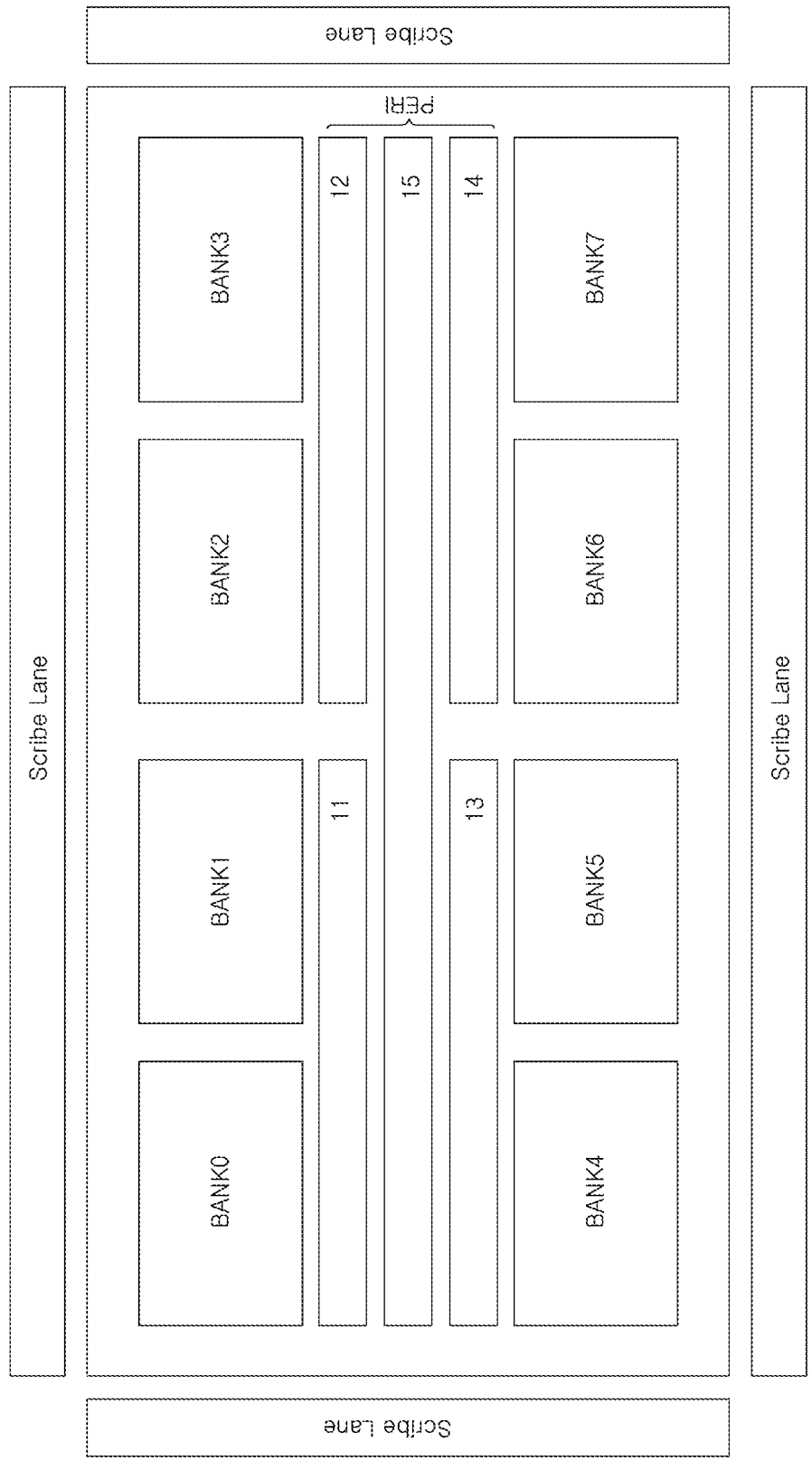
FIG. 1 is a schematic view illustrating the layout of a chip of a conventional semiconductor apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
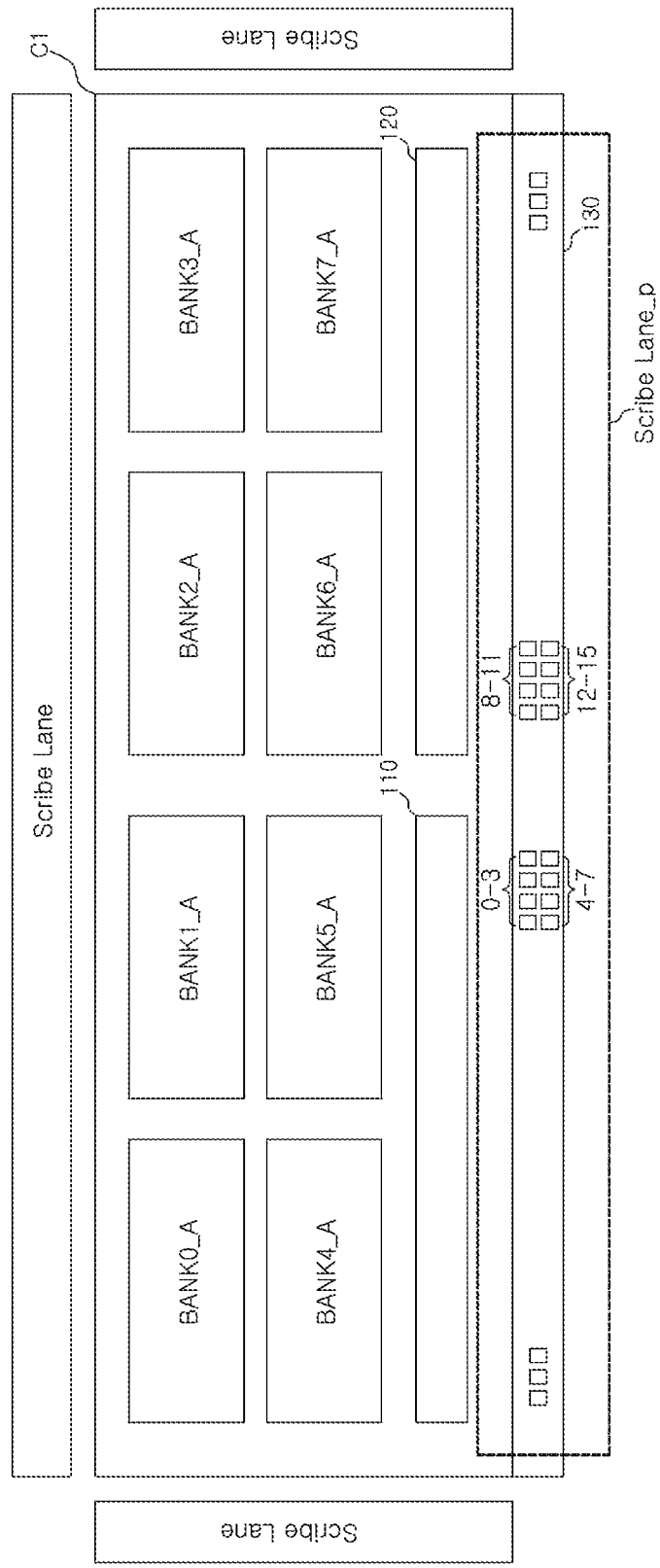
FIG. 2 is a schematic view illustrating an exemplary layout of a chip of a semiconductor apparatus consistent with the present disclosure.

FIG. 2 schematically illustrates an exemplary layout of a semiconductor chip C1 of a semiconductor apparatus consistent with various exemplary aspect of the invention. Referring to FIG. 2, chip C1 includes a plurality of memory banks BANK0_A through BANK7_A. Chip C1 also includes chip operation logic circuits 110 and 120 associated with the operation of the memory banks BANK0_A through BANK7_A. Chip operation logic circuits 110 and 120 may be disposed laterally of the memory banks BANK0_A through BANK7_A, as shown in FIG. 2. In various exemplary embodiments, chip operation logic circuits 110 and 120 may include, but not be limited to, repair circuits for the memory banks BANK0_A through BANK7_A and logic circuits for TSV connections.

In the exemplary embodiment shown in FIG. 2, a probe test logic circuit 130 is disposed laterally of the chip operation logic circuits 110 and 120. Probe test logic circuit 130 refers to, for example, a circuit for enabling a probe test when the chip constituting the semiconductor apparatus is placed on a wafer. The probe test includes various types of tests such as, for example, but not limited to, an internal bias test and a memory cell repair test. Accordingly, probe test logic circuit 130 may be provided with data pads 0 through 15, voltage pads, etc.

Memory banks BANK0_A through BANK7_A and chip operation logic circuits 110 and 120 are surrounded by scribe lanes Scribe Lane. The scribe lanes Scribe Lane serve as cutting portions for separating chip C1 from other chips placed on the wafer.

In one exemplary embodiment of the invention, as shown in FIG. 2, probe test logic circuit 130 may serve as a cutting portion (e.g., a scribe lane Scribe Lane_p) for separating chip C1 from a neighboring chip after a probe test is performed.

As mentioned above, a three-dimensional semiconductor apparatus includes a plurality of chips stacked vertically, and the electrical connection between the stacked chips is effected by means of TSVs. Accordingly, all the stacked chips may not need to have logic circuits for ensuring the normal operation of the semiconductor apparatus. When the plurality of chips are packaged into a single semiconductor apparatus, it may be sufficient to provide a logic circuit for ensuring the normal operation to only a master chip, and each of slave chips can be provided only with a memory bank for storing data and minimum logic circuits capable of communicating with the master chip. Thus, each slave chip may include, among other things, one or more TSVs connected to the master chip, a logic circuit for controlling the TSVs, and a fuse circuit for repairing a defective cell of a memory bank. But, probe test logic circuit 130 that includes pads may not be needed in the slave chips.

However, when the chips are manufactured, a probe test logic circuit including the pads should be provided on the wafer so as to enable a probe test for securing the reliability of the chips. Therefore, in various exemplary embodiments of the invention, probe test logic circuit 130 is disposed in scribe lane Scribe Lane_p so that probe test logic circuit 130 can be removed after the probe test is conducted. This may effectively increase the total number of chips that can be placed on a wafer.

Figure 3:
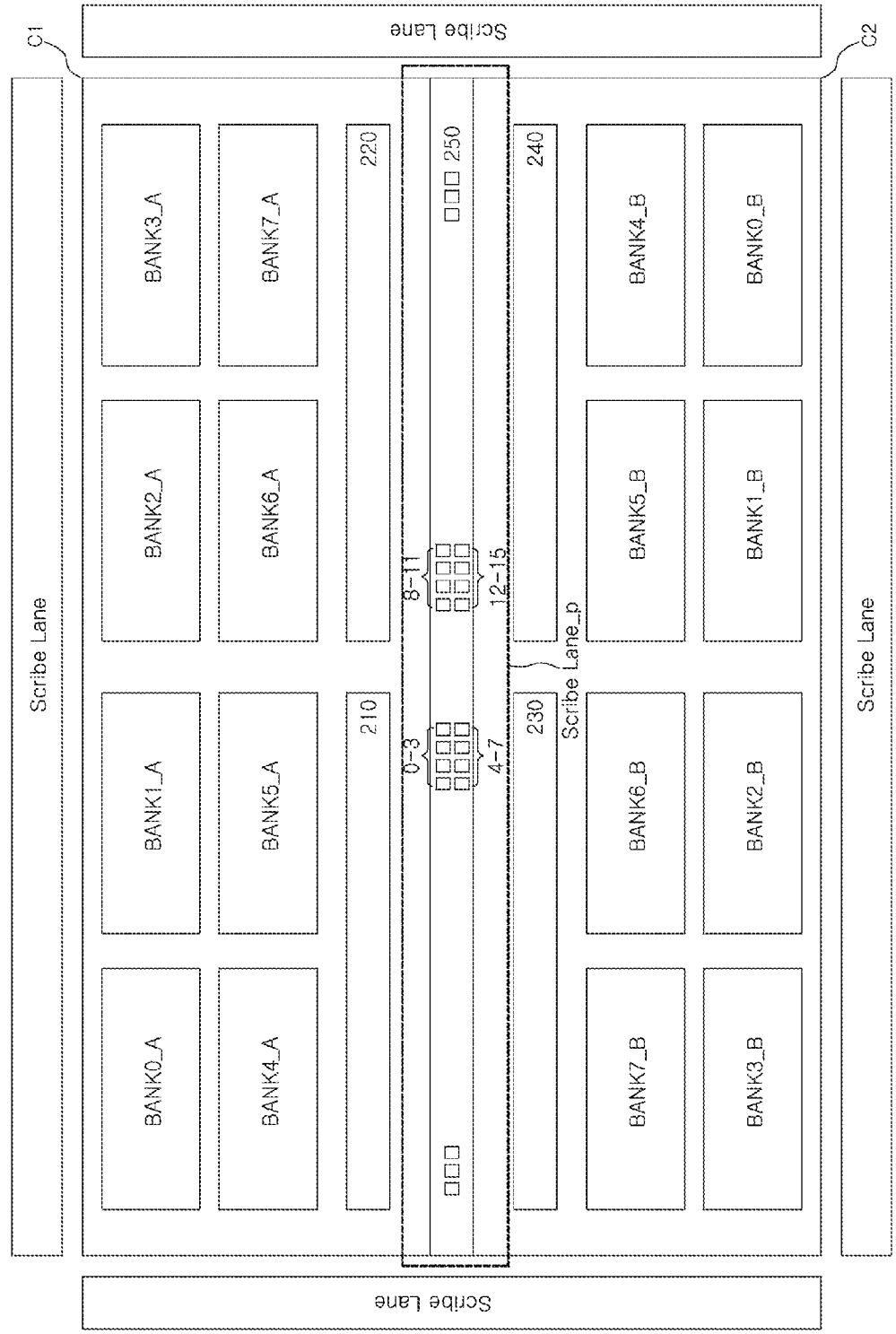
FIG. 3 is a schematic view illustrating another exemplary layout of a chip of a semiconductor apparatus consistent with the present disclosure.

FIG. 3 is a schematic view illustrating another exemplary layout of a chip of a semiconductor apparatus consistent with various exemplary aspects of the invention. In the embodiment shown in FIG. 3, a first chip C1 and a second chip C2 share a probe test logic circuit 250.

First chip C1 may include a plurality of memory banks BANK0_A through BANK7_A and first chip operation logic circuits 210 and 220, which are associated with the operation of first chip C1. Similarly, second chip C2 may include a plurality of memory banks BANK0_B through BANK7_B and second chip operation logic circuits 230 and 240, which are associated with the operation of second chip C2. Probe test logic circuit 250 is disposed between first and second chips C1 and C2 adjacent to first chip operation logic circuits 210 and 220 and second chip operation logic circuits 230 and 240. After a probe test is completed, probe test logic circuit 250 may serve as a cutting portion (e.g., a scribe lane Scribe Lane_p) for separating first chip C1 and second chip C2 from one another. Other scribe lanes Scribe Lane are formed to surround first and second chips C1 and C2, as shown in FIG. 3. Scribe lanes Scribe Lane serve as cutting portions for separating first and second chips C1 and C2 from other neighboring chips.

Probe test logic circuit 250 can perform a probe test for both first and second chips C1 and C2. That is, probe test logic circuit 250 can be shared by both first and second chips C1 and C2 during a probe test.

According to one exemplary aspect, memory banks BANK0_A through BANK7_A of first chip C1 and memory banks BANK0_B through BANK7_B of second chip C2 may be disposed at topologically opposite positions from one another (e.g., mirror structures). More specifically, first memory bank BANK0_B of second chip C2 may be disposed at a position corresponding to a position where first memory bank BANK0_A of first chip C1 would be disposed when first chip C1 is rotated by 180° with respect to the midpoint of the plane separating first and second chips C1 and C2. Similarly, memory banks BANK1_B through BANK7_B of second chip C2 may be disposed at positions corresponding to positions where memory banks BANK0_A through BANK7_A of first chip C1 would be disposed when first chip C1 is rotated by 180°. When first chip C1 and second chip C2 share probe test logic circuit 250, placing the respective memory banks of first and second chips C1 and C2 in a topologically opposite positions from one another may further increase the percentage of acquiring good-quality products.

Accordingly, the electrical connection between memory banks BANK0_A through BANK7_A of first chip C1 and probe test logic circuit 250 may be logically opposite to the electrical connection between memory banks BANK0_B through BANK7_B of second chip C2 and probe test logic circuit 250. For example, assuming that first through fourth pads (0-3), fifth through eighth pads (4-7), ninth through twelfth pads (8-11), and thirteenth through sixteenth pads (12-15) are provided for a probe test as shown in, for example, FIG. 3, first and fifth memory banks BANK0_A and BANK4_A of first chip C1 can be electrically connected sequentially to first through fourth pads 0 through 3, and first and fifth memory banks BANK0_B and BANK4_B of second chip C2 can be electrically connected sequentially to sixteenth through thirteenth pads 15 through 12. Similarly, second and sixth memory banks BANK1_A and BANK5_A of first chip C1 can be electrically connected sequentially to fifth through eighth pads 4 through 7, and second and sixth memory banks BANK0_B and BANK5_B of second chip C2 can be electrically connected sequentially to twelfth through ninth pads 11 through 8. Further, third and seventh memory banks BANK2_A and BANK6_A of first chip C1 can be electrically connected sequentially to ninth through twelfth pads 8 through 11, and third and seventh memory banks BANK2_B and BANK6_B of second chip C2 can be electrically connected sequentially to eighth through fifth pads 7 through 4. Fourth and eighth memory banks BANK3_A and BANK7_A of first chip C1 can be electrically connected sequentially to thirteenth through sixteenth pads 12 through 15, and fourth and eighth memory banks BANK3_B and BANK7_B of second chip C2 can be electrically connected sequentially to fourth through first pads 3 through 0.

With the above-described electrical connections, the respective memory banks of first chip C1 and second chip C2 can have the mirror structures. Accordingly, even though first chip C1 and second chip C2 share probe test logic circuit 250, they can be manufactured as chips having the same structure. Thus, when chips are disposed on a wafer in a manner consistent with the present disclosure, it would be possible to manufacture the chips having the identical configuration.

Figure 4:
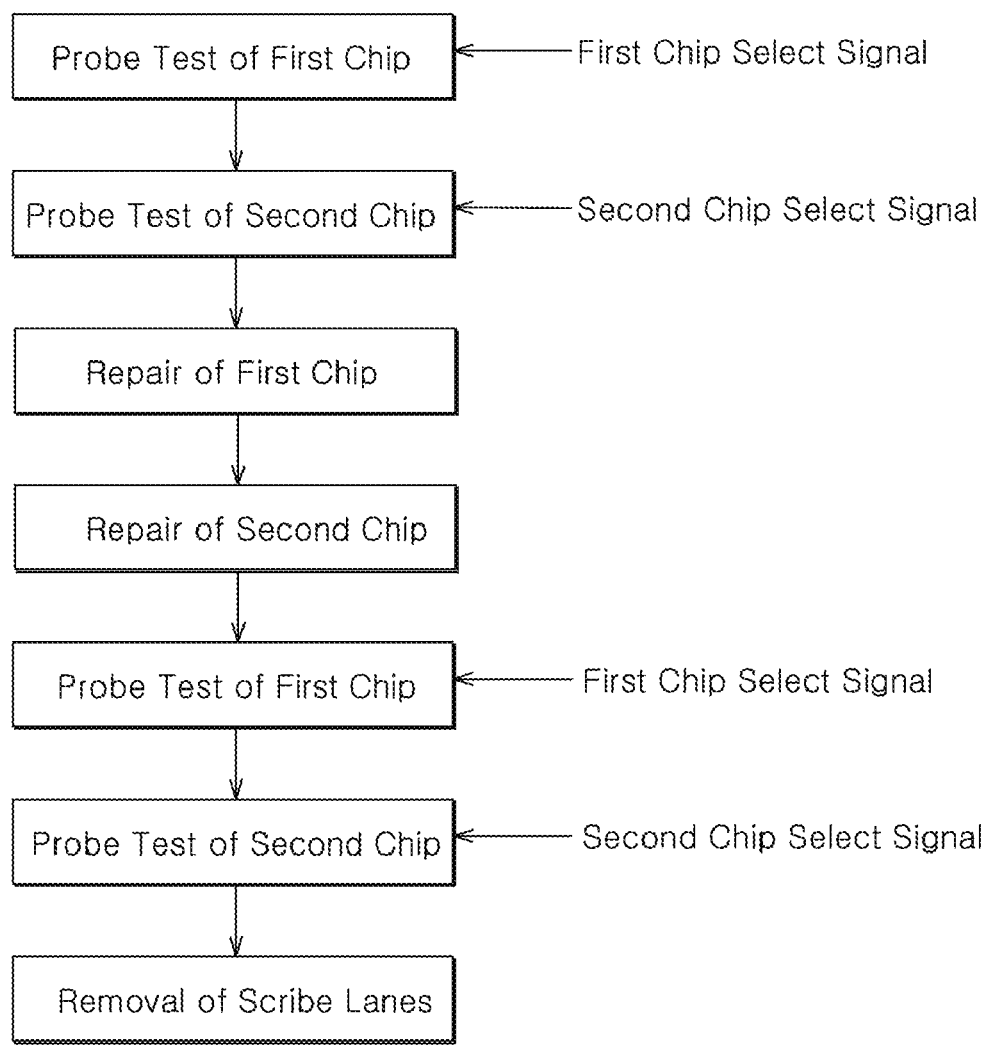
FIG. 4 is a flow chart explaining an exemplary probe test method of a semiconductor apparatus consistent with the present disclosure.

FIG. 4 is a flow chart explaining an exemplary method of probe testing a semiconductor apparatus according to various aspects of the invention. The exemplary probe testing method will be described herein with reference to FIGS. 3 and 4.

First, first chip C1 is activated in response to a first chip select signal, and a probe test of the first chip C1 is performed. Memory banks BANK0_A through BANK7_A of first chip C1 are connected to first through sixteenth pads 0 through 15 so that the probe test can be performed. When the probe test of first chip C1 is completed, second chip C2 is activated in response to a second chip select signal, and a probe test of the second chip C2 is performed. Memory banks BANK0_B through BANK7_B of second chip C2 are connected to sixteenth through first pads 15 through 0 so that the probe test can be performed. The first and second chip select signals may be signals generated from command signals applied from an external source.

When the probe tests of first and second chips C1 and C2 are completed, a repair step may be performed on first chip C1 depending on the probe test results of first chip C1. The logic circuit associated with the repair step may be included in first chip operation logic circuits 210 and 220 shown in the embodiment of FIG. 3. During the repair step, the internal voltage of first chip C1 may be corrected. Alternatively or additionally, a repair operation for repairing a defective memory cell may be performed during the repair step. In some embodiments, the repair operation can be performed by cutting a fuse circuit included in first chip operation logic circuits 210 and 220.

When the repair step of first chip C1 is completed, a repair step of second chip C2 may be performed. Similarly to first chip C1, the logic circuit associated with the repair step of second chip C2 may be included in second chip operation logic circuits 230 and 240 shown in the embodiment of FIG. 3.

According to one aspect of the invention, the probe tests of first and second chips C1 and C2 may be conducted prior to performing the repair step of first and second chips C1 and C2. This arrangement may be beneficial because the cost and time required to set up and use the necessary test equipments for detecting through the probe tests and for conducting the repair step could be significant.

When the repair step of first and second chips C1 and C2 is completed, probe tests of first and second chips C1 and C2 can be performed again. The first probe tests of first and second chips C1 and C2 may be performed to analyze defect information of first and second chips C1 and C2, and the second probe tests of first and second chips C1 and C2 may be performed to confirm whether the repair step of first and second chips C1 and C2 has been properly carried out.

When the second probe tests are completed, probe test logic circuit 250 used for the probe tests may be removed as the scribe lane Scribe Lane_p, and first and second chips C1 and C2 become separated. Since first and second chips C1 and C2 have the identical physical configuration, it would not be necessary to sort the chips when packaging the chips.

Throughout the description, including in the claims, the term "comprising a" should be understood as being synonymous with the term "comprising at least one" unless otherwise specified to the contrary.

While certain embodiments have been described above with reference to illustrative embodiments for particular applications, it should be understood that the embodiments described are by way of example only. Those skilled in the art with access to the teachings provided in this disclosure will recognize additional modifications, applications, and/or embodiments and additional fields in which the present disclosure would be of significant utility. Accordingly, the disclosed semiconductor apparatus and the related probe test method described herein should not be limited to the described embodiments. Rather, they should only be limited in light of the claims that follow when taken in conjunction with the above description and accompanying drawings.

What is claimed is:

1. A semiconductor apparatus comprising:
a first chip having a first to mth memory banks, wherein m is a natural number equal or greater than 2;
a second chip having a first to mth memory banks;
a scribe lane disposed between the first and second chips; and
a probe test logic circuit for probe testing both the first and second chips, wherein the probe test logic circuit is disposed on the scribe lane;
a probe pad having a first to nth probe pads, wherein n is natural number equal or greater than 2;
wherein the scribe lane and the probe test logic circuit disposed on the scribe lane are removed after the probe tests are completed;
wherein the first to mth memory banks of the first chip are sequentially electrically connected with the first to nth probe pads, and the first to mth memory banks of the second chip are sequentially electrically connected with the nth to the first probe pads.

2. The semiconductor apparatus according to claim 1, wherein the first chip comprises a first chip operation logic circuit associated with operation of the first to mth memory banks.

3. The semiconductor apparatus according to claim 2, wherein the first chip operation logic circuit comprises a repair circuit for at least one of the memory banks.

4. The semiconductor apparatus according to claim 2, wherein the first chip operation logic circuit comprises a logic circuit for TSV connection of the first chip.

5. The semiconductor apparatus according to claim 2, wherein the second chip comprises a second chip operation logic circuit associated with operation of the first to mth memory banks.

6. The semiconductor apparatus according to claim 5, wherein the second chip operation logic circuit comprises a repair circuit for at least one of the memory banks.

7. The semiconductor apparatus according to claim 5, wherein the second chip operation logic circuit comprises a logic circuit for TSV connection of the second chip.

8. The semiconductor apparatus according to claim 7, wherein the repair circuit and the logic circuit of the first chip and the repair circuit and the logic circuit of the second chip are disposed adjacent to the probe test logic circuit.

9. The semiconductor apparatus according to claim 5, wherein a disposing sequence of the first to mth memory banks of the first chip is topologically opposite to a disposing sequence of the first to mth memory banks of the second chip.

10. A semiconductor apparatus comprising:
a first chip having a plurality of memory banks;
a second chip having a plurality of memory banks;
a scribe lane disposed between the first and second chips; and
a probe test logic circuit for probe testing both the first and second chips, wherein the probe test logic circuit is disposed on the scribe lane;
wherein the scribe lane and the probe test logic circuit disposed on the scribe lane are removed after the probe tests are completed;
wherein a disposing sequence of the plurality of memory banks of the first chip is topologically opposite to a disposing sequence of the plurality of memory banks of the second chip.

11. The semiconductor apparatus according to claim 10, wherein the first chip further comprises a first chip operation logic circuit associated with operation of the plurality of memory banks of the first chip.

12. The semiconductor apparatus according to claim 11, wherein the first chip operation logic circuit comprises a repair circuit for at least one of the memory banks of the first chip.

13. The semiconductor apparatus according to claim 11, wherein the first chip operation logic circuit comprises a logic circuit for TSV connection of the first chip.

14. The semiconductor apparatus according to claim 11, wherein the second chip further comprises a second chip operation logic circuit associated with operation of the plurality of memory banks of the second chip.

15. The semiconductor apparatus according to claim 14, wherein the second chip operation logic circuit comprises a repair circuit for at least one of the memory banks of the second chip.

16. The semiconductor apparatus according to claim 14, wherein the second chip operation logic circuit comprises a logic circuit for TSV connection of the second chip.

17. The semiconductor apparatus according to claim 10, wherein electrical connection between the first chip and the probe test logic circuit is logically opposite to electrical connection between the second chip and the probe test logic circuit.

* * * * *